Feb. 1, 1966 J. B. ROES 3,231,965

METHOD OF FORMING AN INSULATING BOND

Filed Aug. 30, 1961

Inventor
By JOHN B. ROES
Soans, Anderson, Luedeka & Fitch
Attys

United States Patent Office 3,231,965

Patented Feb. 1, 1966

3,231,965

METHOD OF FORMING AN INSULATING BOND

John B. Roes, San Diego, Calif., assignor to General Dynamics Corporation, New York, N.Y., a corporation of Delaware Filed Aug. 30, 1961, Ser. No. 134,913
2 Claims. (Cl. 29—155.5)

Figure 1:
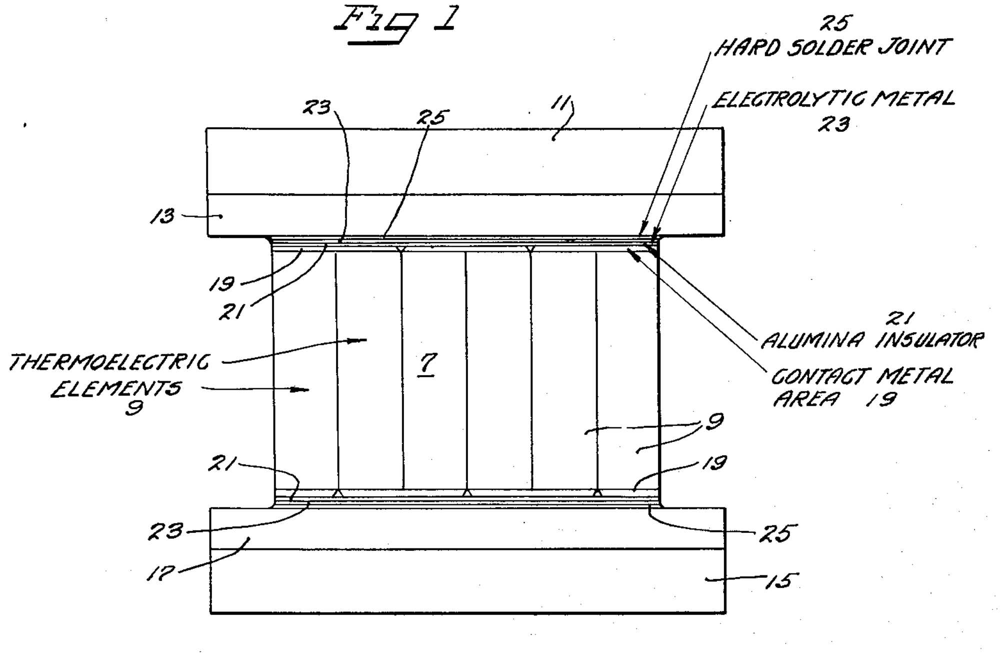

The present invention relates to bonds between surfaces and more particularly relates to a method of forming an improved thermally conducting electrically insulating bond between surfaces. The method has special application in forming an improved bond of the described type between components of a thermoelectric device, particularly between thermoelectric elements and heat exchangers.

Various types of devices require bonds which are electrically insulating yet thermally conductive. Among such devices are some of the thermoelectric type. Difficulties have been encountered in providing the desired bonds capable of withstanding elevated temperatures, etc. encountered in such thermoelectric devices as thermoelectric generators. Thermoelectric generators convert thermal energy into electrical energy, usually at fairly high temperatures, and generally comprise one or more thermoelectric elements disposed between and connected to a heat source and a heat sink which may include heat exchangers, such as metallic sheets, fins, tubes, or the like. For the proper operation of the generator or similar thermoelectric device, it is necessary that the connections between the thermoelectric elements and the heat exchangers have the described high thermal conductivity and good electrical insulating properties. Moreover, it is desirable in most instances to protect such connections against thermal and mechanical stress encountered in the thermoelectric generator during operation thereof, by reason of fluctuation in temperature in the heat source, thermoelectric elements, heat sink and other components, differences in rates of expansion and contraction of interconnected components, etc.

A method has now been discovered for forming an improved bond between surfaces, which bond is thermally conducting and electrically insulating. The method is particularly suitable for joining together the thermoelectric elements and other components of a thermoelectric generator or similar device in a suitable manner which resists thermal and mechanical stress. Thus, the thermoelectric elements of the thermoelectric generator can be connected to the heat exchangers of the device in a manner to provide superior thermal conductivity, minimal electrical conductivity and improved durability (resistance to thermal and mechanical stress). Moreover, the method affords an improved degree of flexibility and adaptability in the particular manner of assembly of the components.

Accordingly, it is the principal object of the present invention to provide improved bonds between surfaces. It is a further object to provide thermoelectric devices having improved components. It is also an object of the present invention to provide a method of joining thermoelectric components to heat exchangers and other metallic surfaces in a manner which is simple, effective, and which provides good thermal contact but minimal electrical contact between the thermoelectric elements and the heat exchangers or other metallic components of the device. It is a further object of the present invention to provide a method of reducing or compensating for thermal and mechanical stress which heat exchangers and other components may tend to inflict upon thermoelectric elements of thermoelectric generators and similar devices during operation of such devices. It is a further object of the present invention to provide improved thermoelectric generators having increased stability against mechanical and thermal stress. It is a still further object of the present invention to provide improved thermally conducting electrically insulating bonds between thermoelectric components, particularly thermoelectric elements and heat exchangers.

Figure 2:
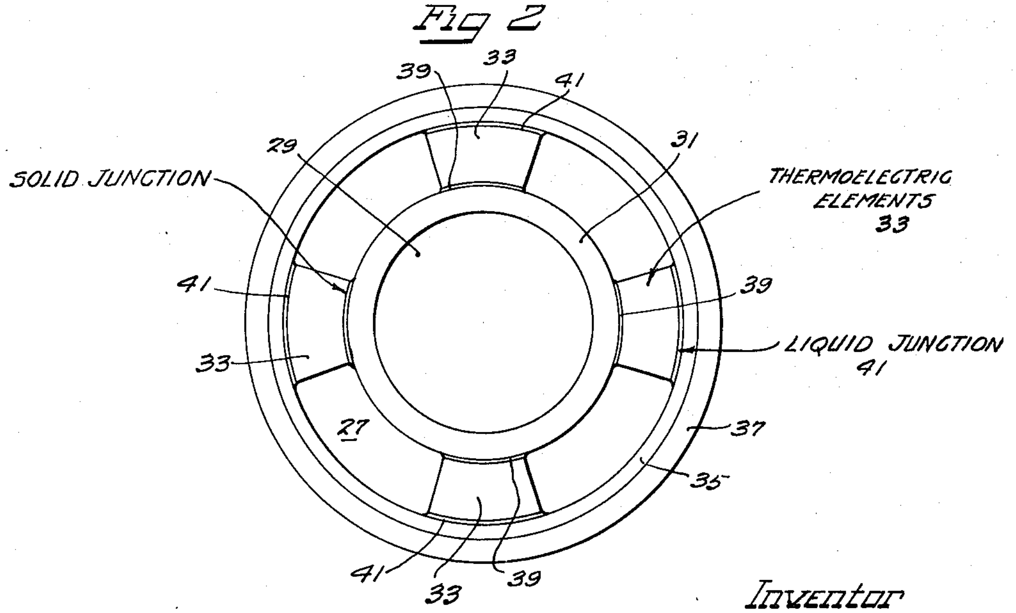

Further objects and advantages of the present invention will be apparent from a study of the following detailed description and of the accompanying drawings of which:

FIGURE 1 is a schematic sectional view of one embodiment of a portion of a thermoelectric generating system employing improved contacts between thermoelectric elements and heat exchangers, in accordance with the present invention; and FIGURE 2 is a schematic view of a second embodiment of a thermoelectric generating system employing improved contacts, in accordance with the present invention, between the thermoelectric elements of the system and associated heat exchangers.

The present invention generally comprises a method of joining two surfaces by a thermally conducting electrically insulating bond. More particularly, the present invention comprises a method whereby a ceramic material is sprayed as a thin film onto a metallic contact area joining together a plurality of thermoelectric elements. The ceramic provides good electrical insulation and superior thermal conductivity. Subsequently, a metallic coating is plated out on the exposed ceramic surface with the aid of an intervening layer of electrically conducting film, such as graphite. The metallic coating can then be readily soldered or brazed to a heat exchanger or other metallic surface. Accordingly, a solid continuous heat conductive path is provided from the heat exchanger through solid metal through the ceramic coating to the thermoelectric element with the ceramic coating acting as an effective barrier against electrical conduction.

Both connections of a given thermoelectric element or bank of thermoelectric elements to heat exchangers, i.e., the connection to a heat exchanger in association with a heat source and the connection to a heat exchanger in association with a heat sink, may be made through the described improved solid bonds. However, in certain configurations of components in thermoelectric generating systems there is a substantial tendency toward relative movement of components connected to the heat source and the heat sink during operation of the thermoelectric generator, so that stress may be imparted to the thermoelectric elements through the solid bonds. In such instances, it is desirable to provide means for compensating for such movement and minimizing stress on thermoelectric components.

In accordance with the present invention, one of the solders or brazes for the connection between the metallic plating on the ceramic film and the associated heat exchanger, that is, either on the hot side or on the cold side of the generator, can be selected to melt below the operating temperature of that side of the thermoelectric generator. Accordingly, in operation, in generator components can be mechanically supported on one side by solid joints melting above the operating temperature of the generator and on the opposite side by a thin liquid metallic film of solder in contact with heat exchangers. This permits relative movement of generator components, due to differential thermal expansion, etc., while minimizing stress on the generator components, particularly the thermoelectric elements thereof.

Now referring more particularly to FIGURE 1 of the accompanying drawings, a thermoelectric generating system 7 employing the improved bonds of the present invention is schematically illustrated in section. This generating system 7 includes a centrally located electrically interconnected series of thermoelectric elements 9 between a heat source with an associated heat exchanger 13 on one side of the system 7 and a heat sink 15 and an associated second heat exchanger 17 on the opposite side of the system 7. The described components can be fabricated from conventional materials in a conventional manner, well known in the thermoelectric generator art.

Thus, for example, the thermoelectric elements 9 may comprise a plurality of conventional p and n type semiconductor slugs electrically interconnected to form a series circuit by strips or contact areas 19 of a suitable electrically conductive material such as copper. The strips 19 may be joined to the thermoelectric elements by conventional means. The heat source may, for example, comprise a nuclear reactor core fuel element (not shown) which, in operation in a nuclear reactor core (not shown), develops a high temperature. The heat sink may, for example, be a plurality of metallic components, or the like, exposed to cooling means such as coolant streams, etc. (not shown). The interposed heat exchangers 13 and 17 may comprise metallic sheets, fins, or tubes of any desirable design, either separately connected to or integral with the respective heat source 11 and heat sink 15.

The heat source and heat sink are thermally interconnected with the thermoelectric elements in an improved manner.

In accordance with the present invention, the metallic electrically conducting contact areas 19 on each side of the thermoelectric elements, are sprayed or otherwise suitably coated with a thin film 21 of a ceramic material. In this regard, such metallic contact areas 19 are preferably flame sprayed with suitable ceramic in molten form, so that the ceramic solidifies in a thin electrically insulating thermally conducting layer over the surface thereof.

The ceramic material may be any such ceramic which can be readily applied, has a melting point above the contemplated operating temperature for the thermoelectric generator and which affords suitable electrical insulating and thermal conducting properties. The ceramic, of course, should not interfere with normal operation of the thermoelectric generator.

Although alumina is the preferred ceramic for such purposes, other suitable ceramic materials, such as beryllia, zirconia, and silica, or mixtures thereof, can be utilized for such purposes. The ceramic film should preferably be relatively thin, just sufficient to provide electrical insulation. When, for example, alumina is utilized, a film thickness of approximately 10 mils is preferred.

In accordance with the method of the present invention, after the ceramic film is deposited and solidified in place on the surface of the contact areas on opposite sides of the thermoelectric elements, the surface thereof is plated or otherwise coated with a suitable metallic electrolytic material. It has been found that adequate bonding of the coating 23 of metallic material to the ceramic can be readily effected by plating out a metal such as copper, silver, or other suitable metal of high thermal and electrical conductivity onto the surface of the ceramic by an electroplating process or the like. However, inasmuch as the ceramic is essentially electrically nonconductive, in order to effect substantial metal plating by electrolytic means, a thin layer of graphite should be first applied to the surface of the ceramic. For example, a colloidal graphite composition can be sprayed on the ceramic surface. The graphite allows the alumina to become, in effect, one electrode and, by a suitable electrical connection with a source of the metal to be plated and an imposition of a direct current on the plating metal, effective electroplating occurs, with deposition of the plating metal in controlled amounts on the ceramic. The normally relatively irregularly contoured surface of the ceramic aids in forming an intimate contact and bond with the metal so plated out on the ceramic surface. Very thin layers of metal, a small fraction of an inch, can be plated out on the ceramic surface and are effective in serving as a metallic support for joining to another metallic surface (such as a heat exchanger) by soldering, etc.

It will be understood that other means for plating out the metal on the ceramic surface can be employed.

The metal coating 23 is then joined to the associated metallic heat exchanger, or other metallic surface by conventional means, as by soldering, brazing, etc., to provide a solid joint 25 so that a continuous heat path is formed from the heat exchanger to the thermoelectric elements. Such pathway is electrically insulating, due to the ceramic coating.

It is preferred that soldering be carried out for the solid joint 25 and that a solder be selected which has a melting point above the operating temperature of the thermoelectric generating system. As will be noted from FIGURE 1, the described method is employed to provide a solid joint 25 between the heat exchanger 13 and metal coating 23 on one side of the thermoelectric elements, and a second solid joint 25 between heat exchanger 17 and the metal coating 23 on the opposite side of the thermoelectric elements. Accordingly, two solid joints are provided for the thermoelectric generating system 7.

As shown in FIGURE 2 of the accompanying drawings, a second embodiment of the thermoelectric generating system employs solid joints on one side of a plurality of thermoelectric elements and liquid joints or junctions on the opposite side of the thermoelectric elements. This arrangement has the effect of minimizing stress which might otherwise be exerted on the thermoelectric elements by reason of differential expansion and contraction of components, due to a thermal gradient between the heat source and heat sink, etc.

Now referring more particularly to FIGURE 2 of the accompanying drawings, a second embodiment of a thermoelectric generating system 27 in accordance with the present invention is schematically illustrated in section. A centrally disposed heat source 29 is illustrated in FIGURE 2, around which is disposed an associated heat exchanger 31. Arranged around the periphery of the heat exchanger 31 are a plurality of electrically interconnected thermoelectric elements 33. A second heat exchanger 35 and an integrally connected heat sink 37 are disposed peripherally of the thermoelectric elements. The heat exchanger 31 of the system is joined to the thermoelectric elements 33 at a plurality of junctions 39, in accordance with the previously described method of the present invention. The heat exchanger 35 is joined to the thermoelectric elements 33 at a plurality of junctions 41, in accordance with the second embodiment of the method of the present invention.

Components of the thermoelectric generating system are substantially as described with regard to the embodiment set forth in FIGURE 1. Thus, with regard to junctions 39, the soldering or brazing compound joining the heat exchanger 31 associated with the heat source 29 to the metal plated ceramic coated contact areas on one side of the thermoelectric elements is one which melts at a temperature above the operating temperature of the cold side of the thermoelectric generating system. However, regarding the junction 41, the soldering or brazing compound connecting the heat exchanger 35 associated with the heat sink 37 to the metal plated ceramic coated contact areas on the opposite side of the thermoelectric elements melts below the operating temperature of the hot side of the thermoelectric generating system. Accordingly, the thermoelectric generating system set forth in FIGURE 2 employs solid junctions 39 between the exchanger 31 of the heat source 29 and the thermoelectric elements and, at the operating temperature of the hot junction, liquid junctions 41 between the thermoelectric elements and the second heat exchanger 35 associated with the heat sink 37. With such an arrangement, the heat sink 37 can move relative to the heat source in response to temperature changes, etc., without mechanically stressing the thermoelectric elements. This results in an improved durability and stability for the described thermoelectric generating system.

Variations in the degree of thermal expansion between the heat exchanger associated with the heat source and that associated with the heat sink result in variations in liquid metal film thickness at the liquid junctions. Such variations do not normally affect the efficiency of operation of the thermoelectric generator. The liquid film of metal and associated components are kept in place by the mechanism of surface tension during the operation of the device.

In general, it is usually advisable to provide liquid junctions at the cold side or heat sink side of the thermoelectric generating system rather than on the heat source side of the system so as to reduce evaporation losses at the liquid junction during operation of the thermoelectric generating system. Wherever the liquid junction is employed, a suitable liquid junction metal can be selected. Preferred metals include Woods metal, mercury, soft solder, tin, and the like. The particular metal or metal alloy selected will depend upon the operating temperature, etc.

It will be understood that in a given instance, it may be desirable to arrange components of the thermoelectric generating system so as to provide liquid junctions between the thermoelectric elements and the heat exchanger associated with the heat source, and solid junctions between the thermoelectric elements and the heat exchanger associated with the heat sink. At any rate, for stability in the system, the thermoelectric elements should be connected on at least one side through a solid junction, i.e., on either the heat source or the heat sink side.

The following examples illustrate certain aspects of the present invention.

*Example I*

The copper metal contact areas of a plurality of electrically interconnected p and n type semiconductor thermoelectric elements in a thermoelectric generator designed to operate with a sot side at 700° C. are flame sprayed with a 10 mil thick film of alumina. The ceramic film is allowed to solidify, after which a thin layer of colloidal graphite is deposited on the ceramic surfaces from a commercially available aqueous colloidal graphite solution. The graphite-coated surface of the alumina is connected electrically to a source of direct current which also connects a source of copper. Direct current is employed to electrolytically plate out the copper onto the graphite-coated alumina surface. Since the alumina surface is irregular, the copper is intimately bonded therewith. The plating operation is carried out until the copper film on the alumina is sufficiently thick to connect to a metal heat exchanger by soldering.

Thereupon, the copper plating is soldered to a heat source heat exchanger, fabricated of copper, by means of a copper base solder comprising 52 percent copper, 38 percent zinc and 10 percent silver and having a melting point of 820° C. and a flow point of 870° C. The solder provides a solid junction during operation of the thermoelectric generator. An identical solid junction is formed on the opposite side of the thermoelectric elements in connecting them to a heat exchanger fabricated of copper and associated with a heat sink. The junctions provided in accordance with the method have superior thermal conductivity and electrical insulating properties.

*Example II*

A thermoelectric generator is constructed in a manner substantially identical with that specified in Example I, utilizing similar components, except that the junction between the heat exchanger for the heat sink and the thermoelectric elements is formed utilizing a solder having a melting point below the operating temperature of the cold side (about 70° C.) of the generator. Such solder comprises bismuth. Solder utilized for the junction between the heat exchanger for the heat source and the thermoelectric element is that described in Example I. This arrangement of a solid junction connecting the thermoelectric elements to the heat source and a liquid junction (at operating temperature) connecting the thermoelectric elements to the heat sink has, in addition to the advantages set forth for the bonds in Example I, the advantage of minimizing mechanical stress on the thermoelectric elements, thereby increasing their durability.

The described method of the present invention is particularly suitable for use in the fabrication of thermoelectric generating systems, but is not limited thereto. The bonds so provided have superior thermal conductivity and electrical insulating properties, and thus are capable of protecting relatively sensitive components, such as thermoelectric elements, connected thereto. Various other advantages of the present invention are set forth in the foregoing.

Various of the features of the present invention are set forth in the appended claims.

What is claimed is:

1. A method of forming an improved, thermally conducting, electrically insulating bond between components of a thermoelectric generator, which method comprises coating metallic contacts disposed on opposite sides of electrically interconnected thermoelectric elements with electrically insulating and thermally conducting films of ceramic material, plating said ceramic films with metal, joining the metal plating at one side of the thermoelectric elements to a metallic component of a first heat exchanger by applying molten metallic bonding material having a melting point below the operating temperature of the first heat exchanger, joining the metal plating at the other side to a metallic component of a second heat exchanger by applying molten metallic bonding material having a melting point between the operating temperature of the second heat exchanger, and solidifying said bonding materials in situ, whereby said heat exchangers are effectively electrically insulated from said thermoelectric elements although in thermally conducting connection therewith, and whereby mechanical stress imparted to said thermoelectric elements is minimized.

2. A method of attaching a thermoelectric element to a heat exchanger with an improved, thermally conducting, electrically insulating bond, which method comprises bonding a metal contact to one end of the thermoelectric element in electrically and thermally conducting relationship, flame-spraying said metal contact with a film of an electrically insulating, thermally conducting ceramic, applying a dispersed film of an electrically conductive material over said ceramic film, electroplating metal on said coated ceramic surface, and joining said metal plating to the metal surface of a heat-exchanger, whereby an electrically insulating, thermally conducting pathway is provided.

References Cited by the Examiner

UNITED STATES PATENTS

| | | | |
|---|---|---|---|
| 1,767,715 | 6/1930 | Stoekle | 117—216 X |
| 2,264,152 | 11/1941 | Rowland | 29—472.9 X |
| 2,844,638 | 7/1958 | Lindenblad. | |
| 2,863,105 | 12/1958 | Ross. | |
| 2,983,031 | 5/1961 | Blanchard | 29—155.5 |
| 3,035,109 | 5/1962 | Sheckler | 136—4 |
| 3,038,049 | 6/1962 | Fritts. | |
| 3,050,843 | 8/1962 | Margolis et al. | 29—472.9 X |
| 3,097,425 | 7/1963 | Kolenko et al. | 29—155.5 |

FOREIGN PATENTS

| | | |
|---|---|---|
| 874,660 | 8/1961 | Great Britain. |

WHITMORE A. WILTZ, *Primary Examiner.*

JOHN F. CAMPBELL, *Examiner.*

UNITED STATES PATENT OFFICE
CERTIFICATE OF CORRECTION

Patent No. 3,231,965 February 1, 1966

John B. Roes

It is hereby certified that error appears in the above numbered patent requiring correction and that the said Letters Patent should read as corrected below.

Column 1, line 37, for "fluctuation" read -- fluctuations --; column 2, line 58, for "in", second occurrence, read -- the --; column 5, line 41, for "sot" read -- hot --; line 48, after "connects" insert -- to --; column 6, line 33, for "below" read -- above --; line 37, for "between" read -- below --.

Signed and sealed this 17th day of January 1967.

(SEAL)
Attest:

ERNEST W. SWIDER
Attesting Officer

EDWARD J. BRENNER
Commissioner of Patents